United States Patent
Mori (10) Patent No.: US 11,301,400 B2
(45) Date of Patent: Apr. 12, 2022

(54) SEMICONDUCTOR STORAGE DEVICE AND CONTROL METHOD THEREOF FOR VARIOUS INTERFACE STANDARDS

(71) Applicant: Kioxia Corporation, Tokyo (JP)

(72) Inventor: Takayuki Mori, Hachioji Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/011,017

(22) Filed: Sep. 3, 2020

(65) Prior Publication Data

US 2021/0294760 A1    Sep. 23, 2021

(30) Foreign Application Priority Data

Mar. 23, 2020  (JP) .............................. JP2020-051263

(51) Int. Cl.
| | |
|---|---|
| *G06F 13/16* | (2006.01) |
| *G11C 11/4072* | (2006.01) |
| *G06F 13/40* | (2006.01) |
| *G06F 9/4401* | (2018.01) |
| *G11C 11/4074* | (2006.01) |
| *G06F 13/38* | (2006.01) |

(52) U.S. Cl.
CPC ........ *G06F 13/1668* (2013.01); *G06F 9/4406* (2013.01); *G06F 13/385* (2013.01); *G06F 13/4068* (2013.01); *G11C 11/4072* (2013.01); *G11C 11/4074* (2013.01)

(58) Field of Classification Search
CPC ........................ G06F 13/1668; G11C 11/4072
See application file for complete search history.

(56) References Cited

U.S. PATENT DOCUMENTS

| | | | |
|---|---|---|---|
| 7,269,022 | B2 | 9/2007 | Yen |
| 9,471,484 | B2* | 10/2016 | Oh .................... G06F 13/1694 |
| 2008/0248692 | A1 | 10/2008 | Ni et al. |
| 2017/0308725 | A1 | 10/2017 | Sardaryan et al. |
| 2020/0034060 | A1* | 1/2020 | Yang .................... G06F 3/0634 |

* cited by examiner

*Primary Examiner* — David E Martinez
(74) *Attorney, Agent, or Firm* — Foley & Lardner LLP (57) ABSTRACT

A semiconductor storage device and a control method thereof applicable to a plurality of different interface standards includes: a nonvolatile semiconductor memory, a first connector, a second connector, a determiner, and a controller. The first connector is provided to connect to an external apparatus with a first standard. The second connector is provided to connect to the external apparatus with a second standard. The determiner outputs a value according to a voltage value of a power supplied from the external apparatus via the first connector or the second connector. The controller controls communication executed between the external apparatus and the nonvolatile semiconductor memory via a connector according to the value output from the determiner among the first connector and the second connector.

13 Claims, 4 Drawing Sheets

|  | POWER SUPPLY THRESHOLD VALUE | USB DETECTION THRESHOLD VALUE |
|---|---|---|
| DETERMINED AS M.2 | EQUAL TO OR LARGER THAN THRESHOLD VALUE | SMALLER THAN THRESHOLD VALUE |
| DETERMINED AS USB | EQUAL TO OR LARGER THAN THRESHOLD VALUE | EQUAL TO OR LARGER THAN THRESHOLD VALUE |
| DETERMINED AS NOT CONNECTED | SMALLER THAN THRESHOLD VALUE | SMALLER THAN THRESHOLD VALUE |

SEMICONDUCTOR STORAGE DEVICE AND CONTROL METHOD THEREOF FOR VARIOUS INTERFACE STANDARDS

CROSS-REFERENCE TO RELATED APPLICATION(S)

This application is based upon and claims the benefit of priority from Japanese Patent Application No. 2020-051263, filed Mar. 23, 2020, the entire contents of which are incorporated herein by reference.

FIELD

Embodiments described herein relate generally to a semiconductor storage device and a control method thereof.

BACKGROUND

In related art, there are semiconductor storage devices in which a nonvolatile semiconductor storage element such as a NAND flash memory is mounted on a substrate on which a connector is formed. The semiconductor storage device is connected to a host device such as a personal computer via the connector.

In such a case, the semiconductor storage device may be restricted in shape, such as a form and/or a size of the substrate, in accordance with a usage environment, a standard, and the like. In addition, in the host device, the number of slots (connectors) of each interface standard may be restricted due to miniaturization and weight reduction.

DETAILED DESCRIPTION

At least one embodiment provides a semiconductor storage device and a control method thereof applicable to a plurality of different interface standards.

In general, according to at least one embodiment, a semiconductor storage device includes a nonvolatile semiconductor memory, a first connector, a second connector, a determiner, and a controller. The first connector is provided to connect to an external apparatus with a first standard. The second connector is provided to connect to the external apparatus with a second standard in which a voltage value of a power supplied from the external apparatus is different from that of the first standard. The determiner is electrically connected to a power line of the first connector and a power line of the second connector, and is configured to output a value according to the voltage value of the power supplied from the external apparatus via the first connector or the second connector. The controller is electrically connected to the nonvolatile semiconductor memory, a signal line of the first connector, and a signal line of the second connector, and is configured to control communication executed between the external apparatus and the nonvolatile semiconductor memory via a connector according to the value output from the determiner among the first connector and the second connector.

Hereinafter, a semiconductor storage device and a control method thereof according to at least one embodiment will be described in detail with reference to the appended drawings. The present disclosure is not limited to the following embodiments.

Figure 1:
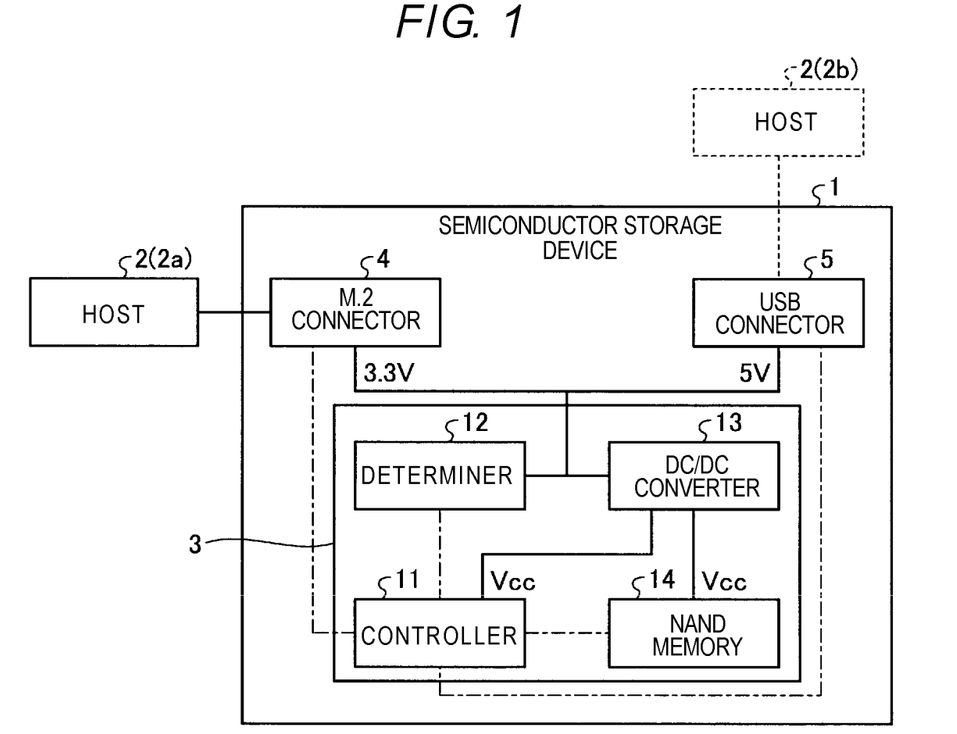
FIG. 1 is a block diagram illustrating an example of a configuration of an information processing system including a semiconductor storage device according to at least one embodiment.

FIG. 1 is a block diagram illustrating an example of a configuration of an information processing system including a semiconductor storage device 1 according to at least one embodiment. An information processing system includes a semiconductor storage device 1 and hosts 2 (2a, 2b).

The semiconductor storage device 1 is used as an auxiliary storage device (external memory) of the hosts 2 (2a, 2b), for example. The semiconductor storage device 1 can receive an access request from the hosts 2. The access request includes a read command and a write command. The semiconductor storage device 1 is configured to be connectable to the hosts 2 via an M.2 connector 4 or a USB connector 5.

The hosts 2 (2a, 2b) are information processing devices (external apparatus) external to the semiconductor storage device 1. The hosts 2 are, for example, a server, a personal computer (PC), a tablet, a smartphone (or mobile phone), and imaging devices such as a still camera (e.g., a digital still camera) (or video camera).

As shown in FIG. 1, the semiconductor storage device 1 includes a ball grid array (BGA) solid state drive (SSD) 3, the M.2 connector 4, and the universal system bus (USB) connector 5.

The BGA-SSD 3 is a one-chip SSD in a BGA package. In the semiconductor storage device 1 according to the embodiment, the BGA-SSD 3 is assumed to be a dynamic random access memory (RAM) (DRAM) (see FIG. 2).

The M.2 connector 4 is a connector for connecting to a host 2 with an M.2 standard (for example, an M.2 standard according to the PCI Express M.2 specification v1). Here, the M.2 standard is an example of a first standard. In addition, the M.2 connector 4 is an example of a first connector. Specifically, the M.2 connector 4 has a form and a size (hereinafter, referred to as a shape) conforming to the M.2 standard. The M.2 connector 4 is a connector on an inserting side (plug). Hereinafter, the host 2 to which the semiconductor storage device 1 is to be connected via the M.2 connector 4 may be referred to as a host 2a. The host 2a is a device on which at least an M.2 slot is mounted as an embedded I/O interface. Here, the M.2 slot has a shape conforming to the M.2 standard. The M.2 slot may be a connector on an inserted side (receptacle). That is, the semiconductor storage device 1 and the host 2*a* are connected by fitting the M.2 connector 4 and the M.2 slot of the host 2*a*.

The USB connector 5 is a connector for connecting to a host 2 with a USB standard. The USB standard is an example of a second standard. The USB connector 5 is an example of a second connector. Specifically, the USB connector 5 has a shape conforming to the USB standard. The USB connector 5 is, for example, a connector on the inserting side (plug). Hereinafter, the host 2 to which the semiconductor storage device 1 is to be connected via the USB connector 5 may be referred to as a host 2*b*. The host 2*b* is a device on which at least a USB slot is mounted as an external I/O interface. Here, the USB slot has a shape conforming to the USB standard. The USB slot is a connector on the inserted side (receptacle). That is, the semiconductor storage device 1 and the host 2*b* are connected by fitting the USB connector 5 and the USB slot of the host 2*b*. The USB connector 5 and the USB slot of the host 2*b* may be connected to each other via a cable or the like whose both ends are configured with connectors on the inserting side. In this case, the USB connector 5 may be configured as a connector on the inserted side (receptacle).

Here, the M.2 standard and the USB standard are different from each other in a voltage value of a power conforming to each standard supplied from the hosts 2 (external direct current power). At least one embodiment illustrates a combination of the M.2 standard and the USB standard, but is not limited thereto. As standards of at least two connectors mounted on the semiconductor storage device 1, a combination of at least two standards in which the voltage values of the power conforming to each standard supplied from the hosts 2 are different from each other may be appropriately used. As the connectors mounted on the semiconductor storage device 1, for example, a connector conforming to a standard such as M.2, Serial Advanced Technology Attachment (SATA) (registered trademark), mSATA, Peripheral Component Interconnect (PCI) express (PCIe) (registered trademark), USB, Serial Attached SCSI (SAS) (registered trademark), multi-media card (MMC)/secure digital memory card (SDC) may be used.

In FIG. 1, in order to illustrate a connection relationship, the semiconductor storage device 1 is simultaneously connected to two hosts 2 including the host 2*a* and the host 2*b*. However, in reality, it is assumed that the semiconductor storage device 1 is connected via either the M.2 connector 4 or the USB connector 5 to one host 2 that can be connected by the connector. The host 2*a* and the host 2*b* may be one device. That is, the hosts 2 may be a device equipped with at least an M.2 slot as the embedded I/O interface and a USB slot as the external I/O interface. In this case as well, the semiconductor storage device 1 is connected to the host 2 via either one of the M.2 connector 4 or the USB connector 5.

As shown in FIG. 1, the BGA-SSD 3 includes a controller 11, a determiner 12, a DC/DC converter 13, and a NAND flash memory (NAND memory 14). At least one of the determiner 12 and the DC/DC converter 13 may be provided outside the BGA-SSD 3. For example, the BGA-SSD 3 may be a one-chip SSD in a BGA package in which the controller 11 and the NAND memory 14 are integrated.

The controller 11 may be configured as, for example, a system-on-a-chip (SoC). The controller 11 may be configured with a plurality of chips. The controller 11 controls the determiner 12, the DC/DC converter 13, and the NAND memory 14. As an example, the controller 11 controls communication executed between the host 2 and the NAND memory 14 via a connector among the M.2 connector 4 and the USB connector 5 according to a value output from the determiner 12. Specifically, the controller 11, based on the value output from the determiner 12, controls (determines) whether to execute communication (data transfer) between the host 2 and the NAND memory 14 via either one of the M.2 connector 4 or the USB connector 5. The controller 11 controls the data transfer between the host 2 and the NAND memory 14 via the connector according to the value output from the determiner 12. The controller 11 is electrically connected to a signal line of the M.2 connector 4, a signal line of the USB connector 5, the determiner 12, the DC/DC converter 13, and the NAND memory 14. Here, the controller 11 is electrically connected to the NAND memory 14 by a bus having a plurality of channels, for example.

Figure 4:
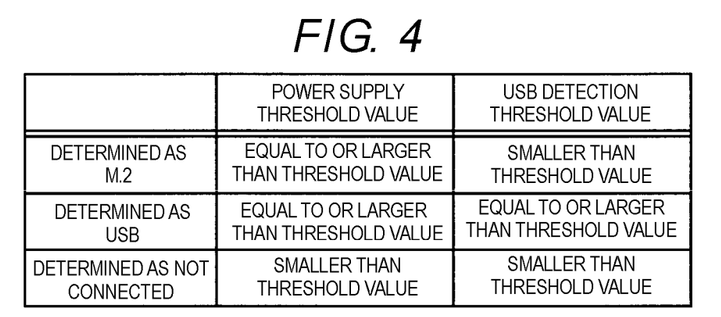
FIG. 4 is a diagram illustrating a relationship between an output of the determiner and the power voltage input to the determiner according to at least one embodiment.

The determiner 12 is a dedicated hardware circuit configured to output a value according to the voltage value of the supplied power (external direct current power) (see FIG. 4). The determiner 12 includes, for example, a circuit configuration such as a field-programmable gate array (FPGA) or an application specific integrated circuit (ASIC). The determiner 12 includes a processor such as a central processing unit (CPU) and a memory such as a RAM, and may be implemented by the processor of the determiner 12 executing a determination program loaded into the RAM. In addition, the determiner 12 may be implemented by the controller 11. The determiner 12 is electrically connected to the controller 11, the power line of the M.2 connector 4 and the power line of the USB connector 5. When the semiconductor storage device 1 is connected to the host 2 via the M.2 connector 4, the power (external direct current power) of the voltage value conforming to the M.2 standard is supplied from the host 2 to the determiner 12. When the semiconductor storage device 1 is connected to the host 2 via the USB connector 5, the power (external direct current power) of the voltage value conforming to the USB standard is supplied from the host 2 to the determiner 12. That is, the determiner 12 outputs the value according to the voltage value of the external direct current power supplied from the host 2 via the M.2 connector 4 or the USB connector 5.

The DC/DC converter 13 generates a plurality of different internal direct current power voltages by using the external direct current power supplied from a power circuit on a host 2 side via the M.2 connector 4 or the USB connector 5. The DC/DC converter 13 supplies these internal direct current power voltages to each circuit in the semiconductor storage device 1. As an example, the DC/DC converter 13 supplies an internal direct current power voltage Vcc to each of the controller 11 and the NAND memory 14. The DC/DC converter 13 detects rising of the external direct current power supplied from the power circuit on the host 2 side, generates a power-on reset signal, and supplies the power-on reset signal to the controller 11. The DC/DC converter 13 is electrically connected to the controller 11, the power line of the M.2 connector 4, the power line of the USB connector 5, and the NAND memory 14. When the semiconductor storage device 1 is connected to the host 2 via the M.2 connector 4, the power (external direct current power) of the voltage value conforming to the M.2 standard is supplied from the host 2 to the DC/DC converter 13. When the semiconductor storage device 1 is connected to the host 2 via the USB connector 5, the power (external direct current power) of the voltage value conforming to the USB standard is supplied from the host 2 to the DC/DC converter 13.

The NAND memory 14 is at least one NAND flash memory. Each of at least one NAND memory 14 includes one or more memory chips. The NAND memory 14 is an example of a nonvolatile semiconductor memory (nonvolatile semiconductor storage element). The NAND memory 14 may be another flash memory.

Figure 2:
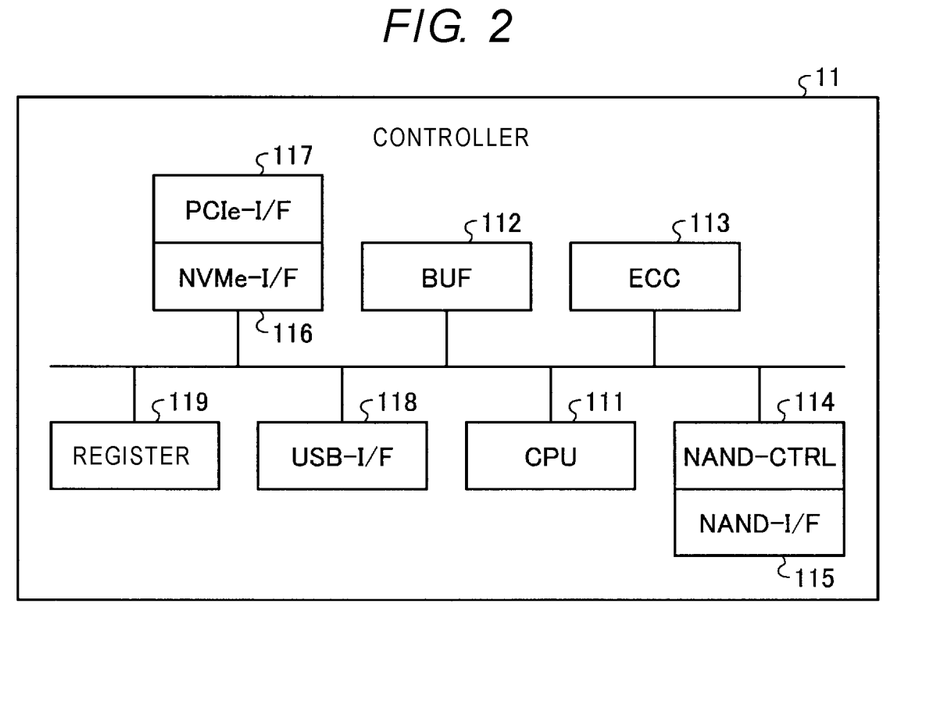
FIG. 2 is a block diagram illustrating an example of a configuration of a controller according to at least one embodiment.

FIG. 2 is a block diagram illustrating an example of a configuration of the controller 11 according to at least one embodiment. As shown in FIG. 2, the controller 11 includes a CPU 111, a buffer (BUF) 112, an ECC 113, a NAND-CTRL 114, a NAND-I/F 115, an NVMe-I/F 116, a PCIe-I/F 117, a USB-I/F 118, and a register 119. The CPU 111, the BUF 112, the ECC 113, the NAND-CTRL 114, the NVMe-I/F 116, the USB-I/F 118, and the register 119 are communicably connected to each other via, for example, a bus.

In the following description, the NVMe-I/F 116, the PCIe-I/F 117, and the USB-I/F 118 may be referred to as a host interface. The NVMe-I/F 116 and the PCIe-I/F 117 may be referred to as a host interface compliant with the M.2 standard. The USB-I/F 118 may be referred to as the host interface compliant with the USB standard. Under control of the CPU 111, the host interface executes control of a communication interface with the hosts 2 and the data transfer (communication) between the hosts 2 and the NAND memory 14 (or BUF 112) of the controller 11. Some or all of functions of the host interface may be executed by the CPU 111.

The CPU 111 is not limited to a CPU, and a processor such as a graphics processing unit (GPU), a micro processing unit (MPU), a digital signal processor (DSP), an FPGA, an ASIC, or a programmable logic device (PLD) may be used as appropriate. The CPU 111 controls the BUF 112, the ECC 113, the NAND-CTRL 114, the host interface, and the register 119. The CPU 111 implements control of the above-described various components by executing various programs such as a determination program and a firmware program loaded into the BUF 112. The firmware program includes a firmware program for performing communication via the M.2 connector 4 with a PCIe standard, and a firmware program for performing communication via the USB connector 5 with the USB standard. It is assumed that various programs such as a determination program and a firmware program are stored in a predetermined area of the NAND memory 14. That is, the controller 11 may be configured with software, hardware, or a combination thereof.

The BUF 112 is a buffer memory that functions as a memory area for temporarily storing information. The BUF 112 is configured with a general-purpose memory such as a static RAM (SRAM). The BUF 112 may be mounted on an outside of the controller 11 independently of the controller 11. As an example, an area of a portion of the DRAM of the host 2 or the NAND memory 14 may be used as the BUF 112.

The ECC 113 encodes data to be sent to the NAND memory 14. The encoding is encoding using an error correction code. The ECC 113 executes the encoding on the data sent from the NAND memory 14, thereby detecting and correcting a bit error contained in the data. An encoding method used by the ECC 113 is not limited to a specific method. In one example, low density parity check (LDPC) may be adopted as the encoding method.

Under the control of the CPU 111, the NAND-CTRL 114 executes the data transfer (communication) between the host 2 (or BUF 112) and the NAND memory 14 via the NAND-I/F 115. The NAND-CTRL 114 is electrically connected to the NAND-I/F 115.

The NAND-I/F 115 is an interface for connecting the NAND memory 14 to the controller 11. Specifically, the NAND-CTRL 114 is electrically connected to each of the one or more memory chips of the NAND memory 14 via the NAND-I/F 115.

The NVMe-I/F 116 performs a process according to a Non-Volatile Memory express (NVMe) (registered trademark) standard. The NVMe-I/F 116 outputs a request (read command) received from the host 2 via the M.2 connector 4, data to be written (user data), and the like to an internal bus. The NVMe-I/F 116 transmits the data (user data) read from the NAND memory 14, a response from the CPU 111, and the like to the host 2 via the M.2 connector 4. The NVMe-I/F 116 is electrically connected to the PCIe-I/F 117.

The PCIe-I/F 117 performs a process according to the PCIe standard. The PCIe-I/F 117 outputs the request (read command) received from the host 2 via the M.2 connector 4, the data to be written (user data), and the like to the internal bus. In addition, the PCIe-I/F 117 transmits the data (user data) read from the NAND memory 14, the response from the CPU 111, and the like to the host 2 via the M.2 connector 4. The PCIe-I/F 117 and the M.2 connector 4 are electrically connected.

The USB-I/F 118 performs a process according to the USB standard. The USB-I/F 118 outputs the request (read command) received from the host 2 via the USB connector 5, the data to be written (user data), and the like to the internal bus. The USB-I/F 118 transmits the data (user data) read from the NAND memory 14, the response from the CPU 111, and the like to the host 2 via the USB connector 5. The USB-I/F 118 and the USB connector 5 are electrically connected.

The register 119 stores an output value from the determiner 12 according to the voltage value of the external direct current power supplied from the host 2 via the M.2 connector 4 or the USB connector 5.

Here, the output value from the determiner 12 according to the embodiment will be described with reference to FIGS. 3 and 4. In the embodiment, the value according to the voltage value of the external direct current power is sequentially output from the determiner 12, and the output value is sequentially stored in the register 119, without being limited thereto. The determiner 12 may be configured to output the value according to the voltage value of the external direct current power upon a control signal from the CPU 111. The register 119 may be configured to store the output value of the determiner 12 upon the control signal from the CPU 111.

Figure 3:
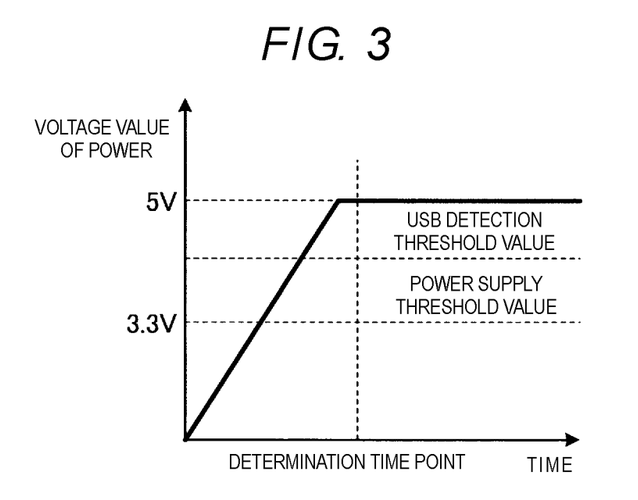
FIG. 3 is a diagram illustrating a transition of a power voltage input to a determiner according to at least one embodiment.

FIG. 3 is a diagram illustrating a transition of the power voltage (external direct current power) input to the determiner 12 according to the embodiment. FIG. 3 illustrates a case where the semiconductor storage device 1 is connected to the host 2 via the USB connector 5. At this time, the power (external direct current power) of the voltage value conforming to the USB standard is supplied from the host 2 to the determiner 12.

The determiner 12 outputs a value indicating a relationship between a predetermined threshold value and the external direct current power supplied from the host 2 via the M.2 connector 4 or the USB connector 5. Here, the predetermined threshold value includes, for example, a power supply threshold value and a USB detection threshold value. The power supply threshold value is a voltage value that is set based on the voltage value of the lowest external direct current power among the powers (external direct current power) of the voltage value conforming to the standard of the connector mounted on the semiconductor storage device 1. Here, the power supply threshold value may be the same value as the voltage value of the external direct current power, or may be a slightly lower value. In the example shown in FIG. 3, since the voltage value conforming to the M.2 standard is 3.3 V and the voltage value conforming to the USB standard is 5 V, the voltage value that is set based on 3.3 V is used as the power supply threshold value. The USB detection threshold value is a voltage value that is set based on the voltage value conforming to the USB standard (5V). Here, the USB detection threshold value may be the same value as the voltage value conforming to the USB standard or may be the slightly lower value.

FIG. 4 is a diagram illustrating a relationship between an output of the determiner 12 and the power voltage (external direct current power) input to the determiner according to the embodiment. The hardware circuit of the determiner 12 is configured based on the predetermined threshold value. Further, the CPU 111 handles the output value from the determiner 12 as a value corresponding to a truth table illustrated in FIG. 4. In the truth table illustrated in FIG. 4, the output value is, for example, a value of 2 bits.

For example, when the semiconductor storage device 1 is connected to the host 2 via the USB connector 5, the voltage value of the external direct current power supplied from the host 2 via the USB connector 5 is equal to or larger than the USB detection threshold value. As described above, the USB detection threshold value is greater than the voltage value conforming to the M.2 standard, that is, the power supply threshold value. Therefore, as shown in FIG. 4, when the voltage value of the external direct current power is equal to or greater than the power supply threshold value and the USB detection threshold value, the determiner 12 outputs a value (output value) that determines that the semiconductor storage device 1 is connected to the host 2 via the USB connector 5.

For example, when the semiconductor storage device 1 is connected to the host 2 via the M.2 connector 4, the voltage value of the external direct current power supplied from the host 2 via the M.2 connector 4 is equal to or larger than the power supply threshold value and smaller than the USB detection threshold value. Therefore, as shown in FIG. 4, when the voltage value of the external direct current power is equal to or larger than the power supply threshold value and smaller than the USB detection threshold value, the determiner 12 outputs the value (output value) that determines that the semiconductor storage device 1 is connected to the host 2 via the M.2 connector 4.

For example, when the semiconductor storage device 1 is not connected to the host 2 via any connector, the external direct current power is not supplied from the host 2 to the semiconductor storage device 1. For example, when the host 2 to which the semiconductor storage device 1 is connected is in a power-off state or when the host 2 is in a low power consumption standby state, the voltage value of the external direct current power supplied from the host 2 is reduced and is smaller than the power supply threshold value. On the other hand, as described above, the USB detection threshold value is larger than the power supply threshold value. Therefore, as shown in FIG. 4, when the voltage value of the external direct current power is smaller than the power supply threshold value and the USB detection threshold value, the determiner 12 outputs the value (output value) that determines that the semiconductor storage device 1 is not connected to the hosts 2.

When the voltage value of the external direct current power is equal to the power supply threshold value, the determiner 12 may be configured to output the value (output value) that determines that the semiconductor storage device 1 is not connected to the hosts 2. When the voltage value of the external direct current power is equal to the USB detection threshold value, the determiner 12 may be configured to output the value (output value) that determines that the semiconductor storage device 1 is connected to the host 2 via the M.2 connector 4.

Figure 5:
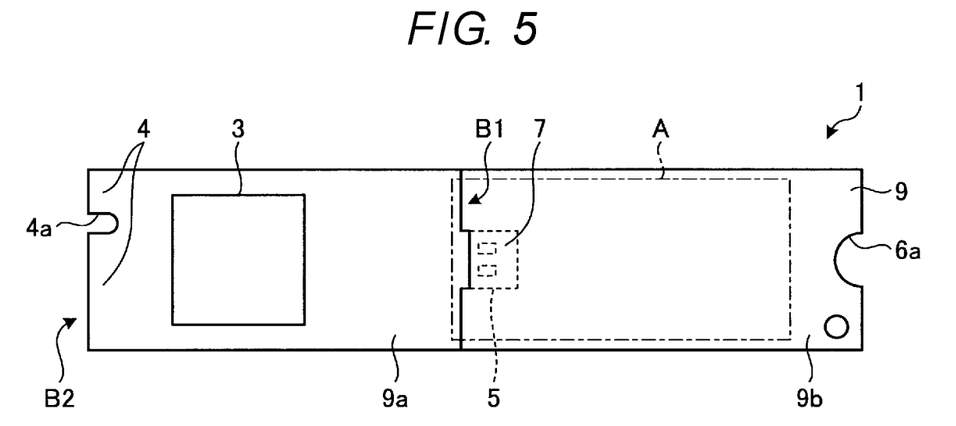
FIG. 5 is a plan view illustrating an example of the semiconductor storage device according to at least one embodiment.

FIG. 5 is a plan view illustrating an example of the semiconductor storage device 1 according to the embodiment. As shown in FIG. 5, the semiconductor storage device 1 further includes a substrate 9. The substrate 9 is, for example, a printed circuit board (PCD) on which a wiring pattern is formed, but may be another substrate. The BGA-SSD 3, the M.2 connector 4, and the USB connector 5 are mounted on the substrate 9. The BGA-SSD 3, the M.2 connector 4, and the USB connector 5 are electrically connected via the wiring pattern formed on the substrate 9. The substrate 9 has a shape conforming to the M.2 standard. FIG. 5 illustrates, as an example, the substrate 9 having a shape conforming to an M.2-2280 standard (M.2 type 2280 as provided for in the PCI Express M.2 Specification v.1). The substrate 9 has a substantially rectangular shape in a plan view. The M.2 connector 4 for connecting to the host 2 is provided at an end portion B2 on one short side of the substrate 9 having a substantially rectangular shape. Here, the end portion B2 is an example of a second end portion. The M.2 connector 4 is, for example, an LIF connector. The M.2 connector 4 is provided with a slit 4a at a position deviated from a center position along a lateral direction of the substrate 9 so as to be fitted with a projection (not shown) or the like provided on an M.2 slot side of the host 2. This makes it possible to prevent the semiconductor storage device 1 from being attached to the hosts 2 upside down. In addition, a notch 6a for inserting a screw is formed at an end portion of the other short side of the substrate 9 (opposite side of the end portion B2 of the substrate 9), and can be screwed to a predetermined position on the host 2 side.

Figure 6:
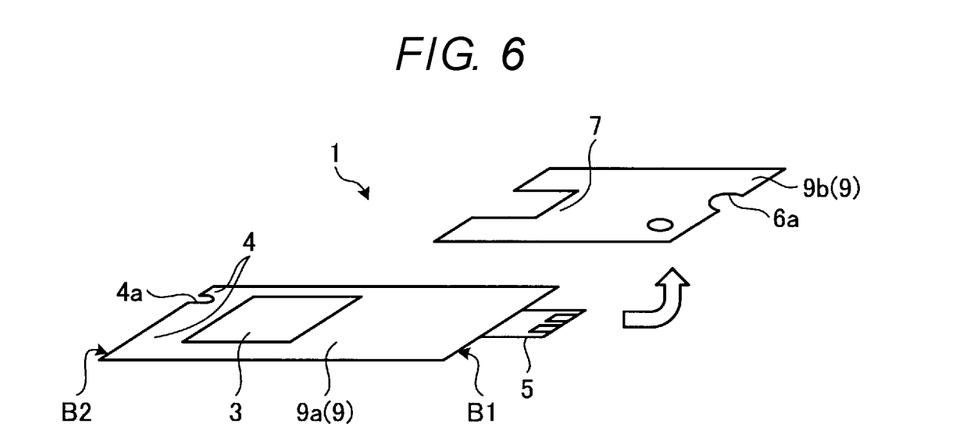
FIG. 6 is a perspective view illustrating an example of a state where a USB connector is exposed in the semiconductor storage device in FIG. 5.

FIG. 6 is a perspective view illustrating an example of a state where the USB connector 5 is exposed in the semiconductor storage device 1 in FIG. 5. As shown in FIGS. 5 and 6, the substrate 9 includes a first substrate 9a and a second substrate 9b. By attaching (connecting) the second substrate 9b to an end portion B1 of the first substrate 9a or by not detaching the second substrate 9b from the end portion B1 of the first substrate 9a, the substrate 9 can have a shape conforming to the M.2 standard. Here, the end portion B1 is an example of a first end portion. Each of the first substrate 9a and the second substrate 9b may be expressed as a part of the substrate 9 divided into two in a longitudinal direction. The substrate 9 may have another shape conforming to the M.2 standard. As another example, the substrate 9 has a shape conforming to an M.2-2242 standard. As another example, the substrate 9 has a shape conforming to an M.2-2230 standard. Here, when the substrate 9 has the shape conforming to the M.2-2230 standard, it may be difficult to mount the USB connector 5 in a free space A due to a size of the substrate 9. In this case, the USB connector 5 can be provided closer to a BGA-SSD 3 side than a position shown in FIG. 5. Further, by setting the shape of the connector on a side where the USB connector 5 is inserted, a space required for mounting the USB connector 5 can be reduced.

The first substrate 9a is a part of the substrate 9 on an M.2 connector 4 side. The BGA-SSD 3, the M.2 connector 4, and the USB connector 5 are mounted on the first substrate 9a. The BGA-SSD 3 is provided between the M.2 connector 4 and the USB connector 5 in the longitudinal direction of the first substrate 9a. When the determiner 12 and the DC/DC converter 13 are provided outside the BGA-SSD 3, the determiner 12 and the DC/DC converter 13 are provided in a vicinity of the BGA-SSD 3 in which the controller 11 and the NAND memory 14 on the first substrate 9a are integrated. The M.2 connector 4 is provided at the end portion B2 of the first substrate 9a. The USB connector 5 is provided at the end portion B1 of the first substrate 9a. The end portion B1 of the first substrate 9a is an end portion of the first substrate 9a, which end portion B1 is different from the end portion B2 on which the M.2 connector 4 is provided. In the example shown in FIG. 5, the end portion B1 of the first substrate 9a is opposite to the end portion B2 on which the M.2 connector 4 is provided in the longitudinal direction of the first substrate 9a. By attaching (connecting) the second substrate 9b to the first substrate 9a or by not detaching the second substrate 9b from the end portion B1 of the first substrate 9a, the USB connector 5 may be provided at another end portion of the first substrate 9a as long as the substrate 9 has the shape conforming to the M.2 standard.

The second substrate 9b is the other part of the substrate 9 on a notch 6a side. The second substrate 9b is detachably connected to the end portion B1 of the first substrate 9a with respect to the first substrate 9a. As shown in FIG. 5, the second substrate 9b is an area corresponding to the free space A of a module type SSD (semiconductor storage device 1) compliant with the M.2 standard on which the DRAM-less BGA-SSD 3 is mounted, of the area on the substrate 9. The second substrate 9b may be formed with, for example, a cover portion 7 having a shape to be fitted to the USB connector 5, that is, a shape in which the USB connector 5 can be inserted.

The cover portion 7 can cover at least a terminal portion of the USB connector 5 when attached to the end portion B1 of the first substrate 9a, that is, when connected to the end portion B1 of the first substrate 9a. On the other hand, the USB connector 5 is exposed to an outside by moving the second substrate 9b with respect to the first substrate 9a, that is, by detaching the second substrate 9b from the first substrate 9a. This makes it possible to prevent the USB connector 5 from coming into contact with other components inside the host 2 and short-circuiting. The cover portion 7 may cover not only the terminal portion of the USB connector 5, but also all portions of the USB connector 5 exposed to the outside when the second substrate 9b is detached from the first substrate 9a. In addition, when the USB connector 5 is the connector on the side to be inserted, the cover portion 7 may be formed in a shape that can be inserted into the USB connector 5, for example. The cover portion 7 may cover at least the terminal portion of the USB connector 5 on a side of at least one main surface (surface shown in a plan view in FIG. 5) of the substrate 9 (the first substrate 9a and the second substrate 9b).

The second substrate 9b may not have the cover portion 7. In this case, the second substrate 9b is provided with a notch having a shape fitting with the USB connector 5 or a shape larger than the shape fitting with the USB connector 5, for example, so as not to physically interfere with the USB connector 5.

The second substrate 9b is not limited to a case where the second substrate 9b is detachably connected to the end portion B1 of the first substrate 9a with respect to the first substrate 9a. As an example, the second substrate 9b is at least connected to the end portion B1 of the first substrate 9a detachably with respect to the first substrate 9a. That is, once detached from the first substrate 9a, the second substrate 9b may not be able to be attached to the end portion B1 of the first substrate 9a thereafter. As a result, the semiconductor storage device 1 can be configured in a simple configuration.

Figure 7:
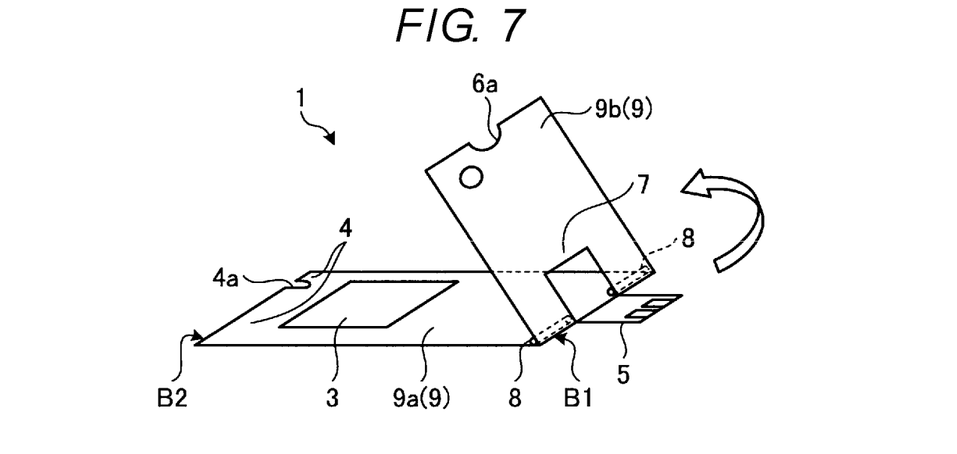
FIG. 7 is a perspective view illustrating another example of the semiconductor storage device according to at least one embodiment, and is a diagram illustrating an example of a state where the USB connector is exposed.

FIG. 7 is a perspective view illustrating another example of the semiconductor storage device 1 according to the embodiment, where a diagram illustrating an example of a state where the USB connector 5 is exposed. As shown in FIG. 7, the second substrate 9b may be connected to the end portion B1 of the first substrate 9a rotatably with respect to the first substrate 9a. In this case, by positioning the first substrate 9a and the second substrate 9b on substantially the same plane, the substrate 9 can have a shape conforming to the M.2 standard. In the example shown in FIG. 7, the second substrate 9b is connected to the end portion B1 of the first substrate 9a via a rotating member 8 such as a hinge. The rotating member 8 is not limited to a hinge, and may have another configuration. In this configuration as well, by rotating (moving) the second substrate 9b with respect to the first substrate 9a, at least the terminal portion of the USB connector 5 can be covered with the cover portion 7 or the USB connector 5 can be exposed to the outside.

As described above, in the semiconductor storage device 1 according to at least one embodiment, the second substrate 9b is connected to the end portion B1 of the first substrate 9a rotatably or detachably with respect to the first substrate 9a. Here, rotation, detachment, attachment, or removal of the second substrate 9b with respect to the first substrate 9a can be expressed as movement of the second substrate 9b with respect to the first substrate 9a.

Hereinafter, an example of an operation of the semiconductor storage device 1 according to the at least one embodiment will be described in more detail with reference to the drawings.

Figure 8:
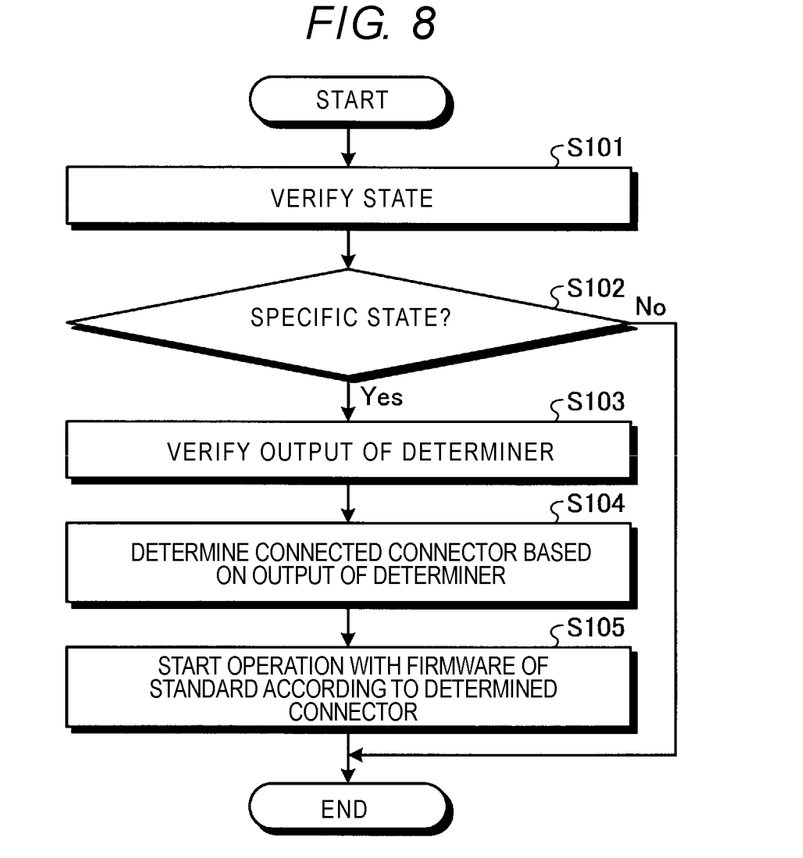
FIG. 8 is a flowchart illustrating an example of a determination process executed by the controller in FIGS. 1 and 2.

FIG. 8 is a flowchart illustrating an example of a determination process executed by the controller 11 in FIGS. 1 and 2. Here, the determination process is a process related to control of which connector among the M.2 connector 4 and the USB connector 5 is used to execute communication. The process in FIG. 8 is implemented by the CPU 111 executing the determination program loaded into the BUF 112, for example. The determination program may be configured as a part of each firmware for executing communication of each standard.

The CPU 111 is started up, that is, in a power-on state upon supply of the power-on reset signal from the DC/DC converter 13. When the power is turned on (started), the CPU 111 verifies a state of the semiconductor storage device 1 (S101). The CPU 111 determines whether the semiconductor storage device 1 is in a specific state (S102). Here, the specific state of the semiconductor storage device 1 means a state in which the CPU 111 cannot grasp the connector used to connect to the host 2. In other words, the specific state of the semiconductor storage device 1 means a state in which the CPU 111 cannot grasp the firmware loaded in the controller 11. As an example, the specific state is a state after an unexpected power-off occurs in the semiconductor storage device 1. The unexpected power-off may occur due to a thermal throttling of the processor (CPU) of the host 2 or the CPU 111. When the power is turned off by a normal procedure or when the power is turned off to reduce a power consumption according to an instruction from the PCIe-I/F 117, information such as firmware loaded in the controller 11 is written in, for example, a predetermined area of the NAND memory 14 before power-off. Therefore, when the power is turned off by the normal procedure or when the power is turned off according to the instruction from the PCIe-I/F 117, the semiconductor storage device 1 may be handled as not being in the specific state.

When the semiconductor storage device 1 is not in the specific state (S102: No), the process in FIG. 8 is completed (END).

When the semiconductor storage device 1 is in the specific state (S102: Yes), the CPU 111 verifies an output of the determiner 12 stored in the register 119 (S103). As shown in FIG. 3, the CPU 111 verifies the output of the determiner 12 at a time point (determination time point) when a time series of the voltage value of the external direct current power converges to a predetermined value. Therefore, if a predetermined time has not elapsed since the power-on reset signal is supplied at a time point of starting the process in S103, the CPU 111 verifies the output of the determiner 12 at the time point (determination time point) after waiting until the predetermined time has elapsed.

The CPU 111 determines the connected connector based on the verified output of the determiner 12 (S104). In other words, the CPU 111 determines which connector among the M.2 connector 4 and the USB connector 5 is used to execute the communication. Thereafter, the CPU 111 loads the firmware of a standard according to the connector determined to be connected to the BUF 112 from a predetermined area of the NAND memory 14, and executes the firmware loaded in the BUF 112. That is, the semiconductor storage device 1 starts an operation as an external memory of a standard according to the connector determined to be connected (S105), and the process in FIG. 8 is completed (END).

As described above, in the semiconductor storage device 1 according to at least one embodiment, the M.2 connector 4 for connecting to the host 2 and the USB connector 5 in which the voltage value of the external direct current power is different from that of the M.2 standard are mounted. The semiconductor storage device 1 according to at least one embodiment outputs the value according to the voltage value of the external direct current power supplied from the host 2 via the M.2 connector 4 or the USB connector 5. The semiconductor storage device 1 according to at least one embodiment controls communication executed between the host 2 and the NAND memory 14 via the connector among the M.2 connector 4 and the USB connector 5 according to the value output from the determiner 12.

According to this configuration, depending on the voltage value of the external direct current power supplied from the host 2 via the connector on a connected side, it is automatically determined which of the M.2 standard and the USB standard is used to start up the controller 11. As a result, in the semiconductor storage device 1, it is possible to implement an automatic two-system operation in which the semiconductor storage device 1 operates with the M.2 standard when embedded in the host 2 such as a PC, and operates with the USB standard when externally attached to the host 2. That is, the semiconductor storage device 1 according to the embodiment can support a plurality of different interface standards.

Even when the hosts 2 are restricted in the number of slots (connector) of each interface standard due to miniaturization and weight reduction, the user can easily use the semiconductor storage device 1 corresponding to a plurality of different interface standards as the external memory according to some embodiments. That is, convenience of the user can be improved.

According to at least one embodiment described above, it is possible to provide a semiconductor storage device and a control method thereof applicable to a plurality of different interface standards.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a nonvolatile semiconductor memory;
   a first connector configured to connect to an external apparatus with a first standard;
   a second connector configured to connect to the external apparatus with a second standard, the second standard having a voltage value of a power supplied from the external apparatus is different from that of the first standard;
   a determiner electrically connected to a power line of the first connector and a power line of the second connector, the determiner configured to output a value according to the voltage value of the power supplied from the external apparatus via the first connector or the second connector; and
   a controller electrically connected to the nonvolatile semiconductor memory, a signal line of the first connector, and a signal line of the second connector, the controller configured to:
      control communication between the external apparatus and the nonvolatile semiconductor memory via a connector, the control being performed according to the value output from the determiner among the first connector and the second connector; and
      start control of which connector among the first connector and the second connector is used to execute the communication, upon supply of a power-on reset signal generated according to the power supplied from the external apparatus.

2. The semiconductor storage device according to claim 1, further comprising:
   a substrate having a shape conforming to the first standard, wherein the nonvolatile semiconductor memory, the first connector, the second connector, the determiner, and the controller are mounted on the substrate.

3. The semiconductor storage device according to claim 2, wherein
   the substrate includes:
      a first substrate, wherein on the nonvolatile semiconductor memory, the controller, the first connector, the second connector, and the determiner are mounted on the first substrate, and
      a second substrate rotatably or detachably connected to a first end portion of the first substrate with respect to the first substrate.

4. The semiconductor storage device according to claim 3, wherein
   the first connector is disposed at a second end portion of the first substrate that is different from the first end portion, and
   the second connector is disposed at the first end portion of the first substrate.

5. The semiconductor storage device according to claim 4, wherein the first end portion is opposite to the second end portion on the first substrate.

6. The semiconductor storage device according to claim 3, wherein
the second connector is configured to be exposed to an outside by moving the second substrate with respect to the first substrate.

7. The semiconductor storage device according to claim 1, wherein
the controller is configured to control which connector among the first connector and the second connector is used to execute the communication based on the value output from the determiner.

8. The semiconductor storage device according to claim 1, wherein
when the controller determines which connector among the first connector and the second connector is used to execute the communication, the controller loads and starts up a firmware program of a standard corresponding to the determined connector.

9. The semiconductor storage device according to claim 1, wherein control of the communication is based on a threshold value of the power supplied from the external apparatus.

10. The semiconductor storage device according to claim 1, wherein a shape and a size of the first connector differ from that of the second connector.

11. A control method, comprising:
in a semiconductor storage device including:
a nonvolatile semiconductor memory;
a first connector configured to connect to an external apparatus according to a first standard; and
a second connector configured to connect to the external apparatus according to a second standard, wherein in the second standard, a voltage value of a power supplied from the external apparatus is different from that of the first standard, the method comprising:
outputting a value according to a voltage value of a power supplied from the external apparatus via the first connector or the second connector;
controlling communication executed between the external apparatus and the nonvolatile semiconductor memory via a connector among the first connector and the second connector according to the output value; and
starting control of the connector among the first connector and the second connector that is used to execute the communication, upon supply of a power-on reset signal generated according to the power supplied from the external apparatus.

12. The method according to claim 11, wherein
the controlling includes controlling which connector among the first connector and the second connector is used to execute the communication based on the output value.

13. The method according to claim 11, wherein
upon determining which connector among the first connector and the second connector is used to execute the communication, loading and starting up a firmware program of a standard corresponding to the determined connector.

* * * * *